(12) United States Patent
He

(10) Patent No.: US 10,720,557 B2
(45) Date of Patent: Jul. 21, 2020

(54) LIGHT-EMITTING DEVICE

(71) Applicant: EPISTAR CORPORATION, Hsinchu (TW)

(72) Inventor: Guan-Ru He, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 63 days.

(21) Appl. No.: 15/367,907

(22) Filed: Dec. 2, 2016

(65) Prior Publication Data

US 2017/0162768 A1 Jun. 8, 2017

(30) Foreign Application Priority Data

Dec. 4, 2015 (TW) .............. 104140676 A

(51) Int. Cl.
| | |
|---|---|
| *H01L 25/13* | (2006.01) |
| *H01L 33/62* | (2010.01) |
| *H05K 1/18* | (2006.01) |
| *H05K 1/02* | (2006.01) |
| *H01L 25/075* | (2006.01) |

(52) U.S. Cl.
CPC ............ *H01L 33/62* (2013.01); *H05K 1/189* (2013.01); *H01L 25/0753* (2013.01); *H05K 1/0274* (2013.01); *H05K 2201/0108* (2013.01); *H05K 2201/0133* (2013.01); *H05K 2201/0145* (2013.01); *H05K 2201/0162* (2013.01); *H05K 2201/09263* (2013.01); *H05K 2201/10106* (2013.01)

(58) Field of Classification Search
None
See application file for complete search history.

(56) References Cited

U.S. PATENT DOCUMENTS

| | | | | |
|---|---|---|---|---|
| 2004/0203189 | A1* | 10/2004 | Chen | ........... H01L 24/97 438/108 |
| 2012/0051005 | A1 | 3/2012 | Vanfleteren et al. | |
| 2012/0154968 | A1* | 6/2012 | Chen | ........... H02H 3/04 361/91.1 |
| 2014/0209360 | A1* | 7/2014 | Peng | ........... H05K 1/028 174/254 |
| 2014/0334137 | A1* | 11/2014 | Hasenoehrl | ........ H01L 25/0753 362/147 |
| 2015/0049477 | A1* | 2/2015 | Huang | ........... H01L 25/0753 362/230 |
| 2015/0084157 | A1* | 3/2015 | Tegen | ........... H01L 21/822 257/528 |
| 2015/0092429 | A1* | 4/2015 | Speer | ........... F21K 9/90 362/418 |
| 2015/0255440 | A1 | 9/2015 | Hsieh | |

\* cited by examiner

*Primary Examiner* — Joseph C. Nicely
*Assistant Examiner* — Lamont B Koo
(74) *Attorney, Agent, or Firm* — Muncy, Geissler, Olds & Lowe, P.C.

(57) ABSTRACT

This disclosure discloses a light-emitting device includes a semiconductor light-emitting element having a first electrode and a second electrode, a transparent layer covering the semiconductor light-emitting element, a stretchable electrical connection structure and an electrical contact portion. The stretchable electrical connection structure is formed in the transparent layer and electrically connects the first electrode, and the electrical contact portion is formed on the transparent layer and electrically connects the second electrode.

6 Claims, 12 Drawing Sheets

LIGHT-EMITTING DEVICE

BACKGROUND

Technical Field

The present disclosure relates to a light-emitting device having a semiconductor light-emitting element and a stretchable electrical connection structure.

REFERENCE TO RELATED APPLICATION

This application claims the benefit of TW Application Serial No. 104140676, filed on Dec. 4, 2015, the content of which is hereby incorporated by reference in its entirety.

DESCRIPTION OF THE RELATED ART

The light-emitting diode is gradually replacing traditional light source in lamps because of various advantages, such as low power consumption, environmental protection, long operational life and small volume.

Some lamp or light-emitting apparatus are designed to have several light-emitting diodes formed within. Therefore, the method of arranging several light-emitting diodes into one structure or apparatus is an important issue while manufacturing lamps or light-emitting apparatuses.

A known manufacturing process is to arrange a certain number of light-emitting diodes on a carrier to form a lamp. The light-emitting diodes are electrically connected to external power through the electrical circuit on the carrier. During the manufacturing process above, the sizes and the shape of the carrier limit the amount of light-emitting diodes formed thereon. In addition, there are various product requirements requiring various carriers of different specifications. Moreover, arrangements of electrical circuit on a carrier and applications of the light-emitting diodes on the carriers are necessarily matched so the manufacturing is getting complicated.

Aforementioned light-emitting diodes on the carrier can be further encapsulated or connected to other elements to form a light-emitting device. A light-emitting device can have a sub-mount having one circuit, one solder on the sub-mount to fix the light-emitting diodes on the sub-mount and to electrically connect the light-emitting diodes and the circuit on the sub-mount, and an electrical connection structure electrically connecting electrodes on two neighboring light-emitting diodes. The carrier can be a lead frame or a mounting substrate to enhance heat dissipation and circuit layout of a light-emitting device.

SUMMARY OF THE DISCLOSURE

This disclosure discloses a light-emitting device.

The light-emitting device comprises a semiconductor light-emitting element having a first electrode and a second electrode, a transparent layer covering the semiconductor light-emitting element, a stretchable electrical connection structure and an electrical contact portion. The stretchable electrical connection structure is formed in the transparent layer and electrically connects the first electrode, and the electrical contact portion is formed on the transparent layer and electrically connects the second electrode.

The light-emitting device comprises a first semiconductor light-emitting element having a first electrode, a second semiconductor light-emitting element having a second electrode, a stretchable connection structure connected the first semiconductor light-emitting element and the second semiconductor light-emitting element, and an electronic element formed on the first semiconductor light-emitting element and electrically connected to the first electrode.

The light-emitting device comprises a first electrical contact portion, a second electrical contact portion, a third electrical contact portion, a fourth electrical contact portion, a first semiconductor light-emitting element electrically connected to the first electrical contact portion and the second electrical contact portion to provide a first light field, a second semiconductor light-emitting element electrically connected to the third electrical contact portion and the fourth electrical contact portion to provide a second light field, a transparent layer covering the first semiconductor light-emitting element and the second semiconductor light-emitting element, and a bendable carrier connecting the first semiconductor light-emitting element and the second semiconductor light-emitting element. The first light field is different from the second light field.

BRIEF DESCRIPTION OF THE DRAWING

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of embodiments of the present disclosure accompanied with the drawings.

Figure 1A:
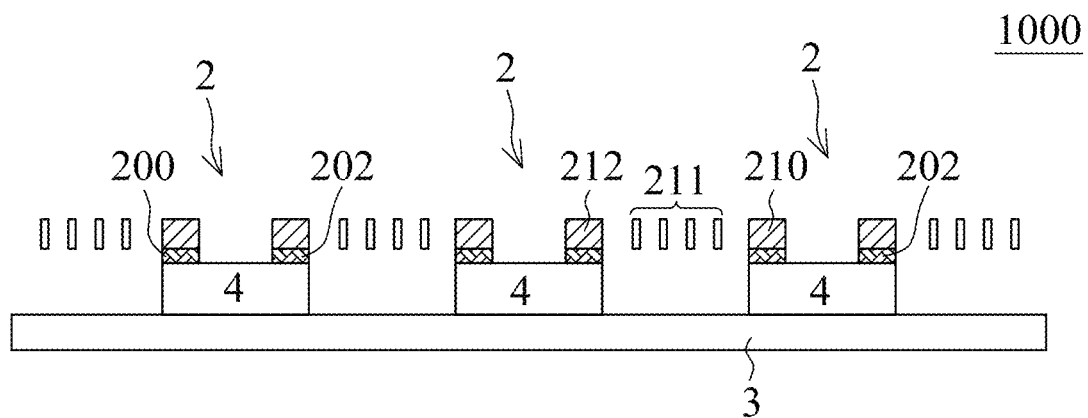
FIG. 1A shows a schematic view of a light-emitting device in accordance with one embodiment of the present disclosure.
Figure 1B:
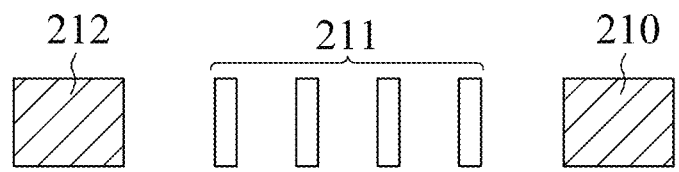
FIG. 1B shows a schematic view of an electrical connection structure in accordance with one embodiment of the present disclosure.

FIG. 1A shows a schematic view of a light-emitting device 1000 in accordance with one embodiment of the present disclosure. The light-emitting device 1000 has several light-emitting elements 2 formed on the carrier 3. The light-emitting element 2 has a semiconductor light-emitting stack 4 and electrodes 200, 202. Two neighboring light-emitting elements 2 are connected by the electrical connection structure, which includes two fix portions 210, 212 and a connection portion 211. In another embodiment, the light-emitting element further comprises a substrate (not shown in the figure) for epitaxial growth or supporting the semiconductor light-emitting stack. FIG. 1B shows a schematic view of an electrical connection structure in accordance with one embodiment of the present disclosure. Referring to FIG. 1B, the electrical connection structure has two fix portions 210 and 212 and a connection portion 211 connecting two fix portions. Referring to FIG. 1A, the fix portion 210 is connected to the electrode 200, the fix portion 212 is connected to the electrode 202, and the connection portion 211 connecting two fix portions 210 and 212 is suspended over the carrier 3. The connection portion 211 of the electrical connection structure is made of conductive material, such as a metal. The structure of the connection portion 211 is designed to be elastic, or can be stretched, compressed, bent, folded, and/or twisted. Therefore, the shape of the light-emitting device 1000 can be easily changed according to the object or surface attached thereto. For example, the connection portion 211 is a bent metal conductive wire having a contour similar to a spring so the shape of the light-emitting device 1000 can be changed within a deformation scope, or can be stretched, compressed, bent, folded, and/or twisted to match the contour of the object attached thereto. The distance between or relative positions of two neighboring light-emitting elements can be the same as or different. The connection portion 211 can physically and electrically connects two neighboring light-emitting elements. Alternatively, the connection portion 211 physically connects only two neighboring light-emitting elements without forming electrical connection. That is, the connection portion 211 can be insulated from the light-emitting element 2 or be made of insulating materials, such as plastic, silicone or silicone rubber, fluorosilicone rubber, fluoroelastomers, and perfluoroelastomers. The connection portion 211 presented in FIGS. 1A and 1B are examples only, and are not used to limit the specific structure of an electrical connection structure. In an embodiment, some connection portions are made by insulating materials, which are called insulating connection portions in the following paragraphs. The insulating connection portions are used to insulate two neighboring light-emitting elements within the light-emitting device 1000. The current cannot pass the insulating connection portion so the light-emitting elements on two sides of an insulating connection portion can be individually driven. In other words, the light-emitting elements on two sides of an insulating connection portion can be driven in the following modes, such as emitting at same or different time interval, at same or different frequency, at same or different luminous and light beams with same or different color. The light-emitting device 1000 can have one or more insulating connection portions. The numbers of light-emitting elements respectively formed on two sides of an insulating connection portion can be the same or different. In another embodiment, one or more conductive connection portions can be further formed between two insulating connection portions.

The carrier 3 is a device supporting the light-emitting element in the following processes. The carrier 3 can be made of a solid material, such as ceramic or sapphire. The material of the carrier can also be flexible or bendable, such as glass fiber, polyethylene terephthalate (PET), Polycarbonate (PC), polyethylene terephthalate (PEN) or triazinylbenzene resin (BT).

Figure 1C:
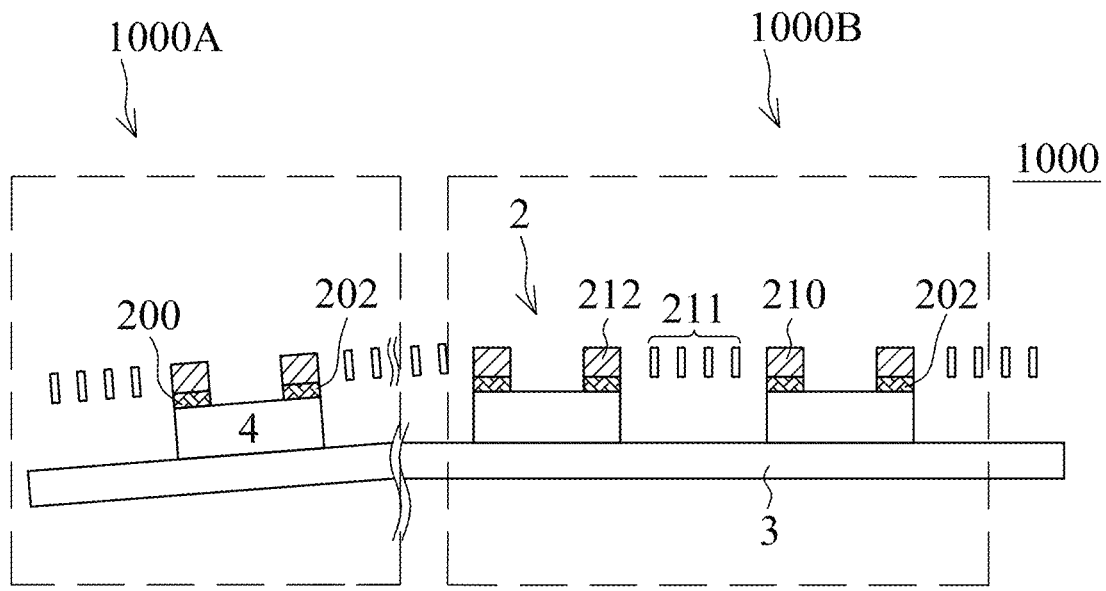
FIG. 1C shows a schematic view of splitting process in accordance with one embodiment of the present disclosure.

Referring to FIG. 1C, after forming the previous structure, the connection portion 211 and the carrier 3 between two neighboring fix portions 201,212 can be split. The separated light-emitting element 2 can be respectively powered to emit light and form individual light-emitting units 1000A and 1000B. In an aspect of manufacturing, a light-emitting device 1000 having a lot of light-emitting elements 2 can be formed in advance, wherein every two of the light-emitting elements 2 can be connected with each other by an electrical connection structure. Then, the light-emitting device 1000 can be split to form a light-emitting unit having a specific amount of light-emitting elements 2 and/or having light-emitting element(s) arranged in a specific pattern.

Figure 2A:
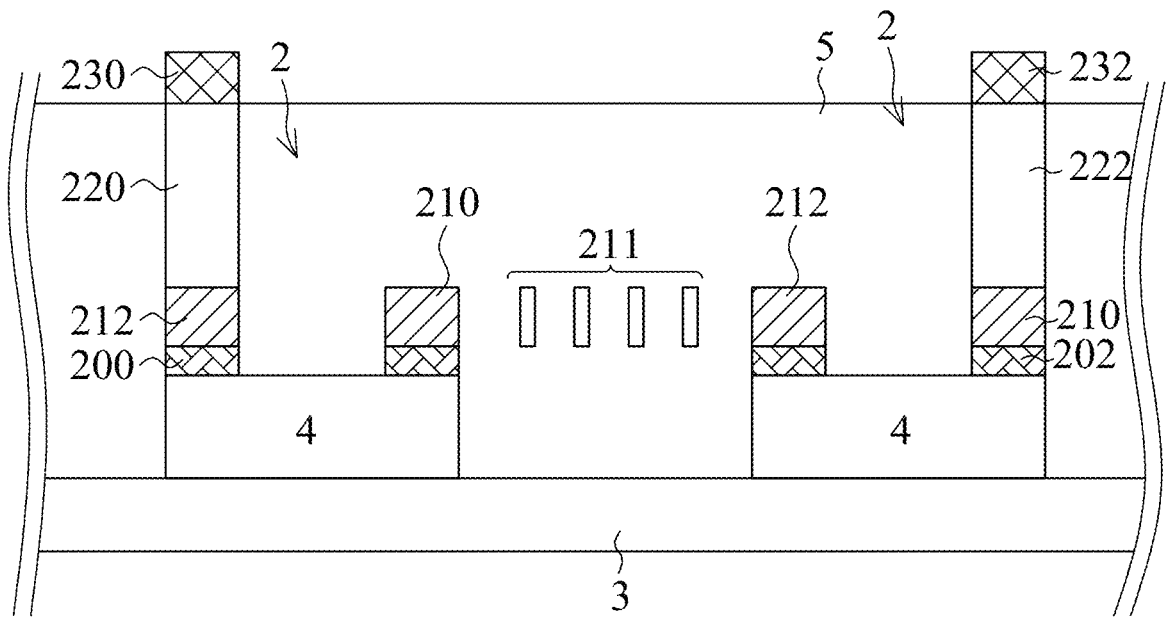
FIGS. 2A~2B show a schematic view of a light-emitting device in accordance with one embodiment of the present disclosure.
Figure 2B:
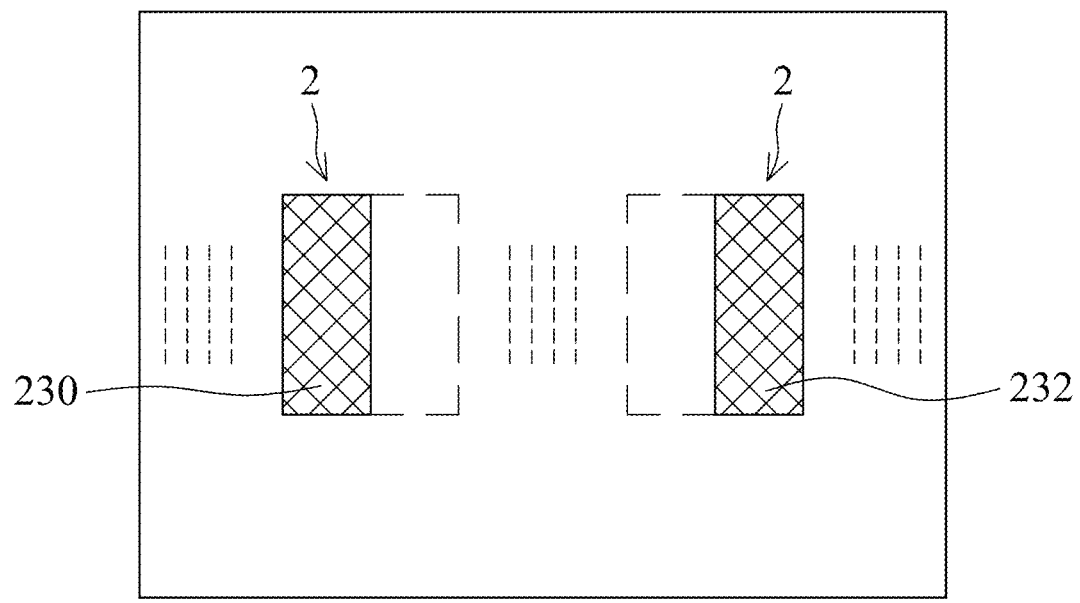

FIG. 2A shows a schematic view of a light-emitting device 2000 in accordance with one embodiment of the present disclosure. The light-emitting device 2000 has light-emitting elements 2 formed on the carrier 3, and the light-emitting elements 2 are connected through electrodes 200, 202 and electrical connection structures 210,211,212. In an embodiment, the light-emitting elements are covered by a transparent layer 5. The electrical contact portions 230, 232 are located on the transparent layer 5, wherein the electrical contact portion 230 is connected to the fix portion 212 through the extension portion 220 and the electrical contact portion 232 is connected to the fix portion 210 through the extension portion 222. Referring to FIG. 2B, the light-emitting device 2000 has electrical contact portions 230 and 232. The light-emitting device 2000 can be powered by external power supply through electrical contact portions 230 and 232. In an embodiment, the transparent layer 5 is transparent or translucent depending on the light emitted from the light-emitting element 2 and can be epoxy or silicone. The transparent layer 5 covers the light-emitting element 2 and the electrical connection structure so air and water are almost isolated to avoid deterioration of electrodes of light-emitting element 2 or deterioration of the electrical connection structure. Moreover, the impact of external force is also reduced or prevented. In another aspect, after the transparent layer 5 is formed, the surface of the electrical contact portion is a substantially flat surface. The flat surface is beneficial for forming an electrical circuit or a structure thereon, such as an electrical circuit or structure formed to be electrically connected to the electrical contact portion. Moreover, a pattern is formed on the surface of the transparent layer 5 to decorate or change optical characteristics, such as light field, color or light-emitting intensity. In another embodiment, the transparent layer 5 has light scattering material or wavelength conversion material formed within. The light scattering material, such as titanium dioxide or silicon dioxide, can scatter the light. The wavelength conversion material, such as phosphor, can convert the wavelength of the light from the light-emitting element 2 into a different wavelength. As shown in FIG. 2B, since the transparent layer 5 is transparent or translucent, the light-emitting element 2 and the electrical connection structure can be obviously seen from the top view or barely seen if scattering particles are added. Even the surface of the light-emitting element, which is not covered by the electrodes 200, 202 can be seen. In another embodiment, in order to avoid forming a light spot from the light-emitting element formed over the transparent layer 5, a shield layer or a reflective layer can be formed on a surface of the light-emitting element 2 facing the transparent layer 5. The thickness of the electrical contact portion is about 1200 nm or between 1000 nm and 3000 nm. The electrical contact portion can be a single layer structure or a multi-layer structure. In order to lower the resistance between the electrode and external circuit, the material of the electrical contact portion includes metal, such as titanium, tungsten, gold, aluminum, indium, tin, platinum, or the combination thereof. In an embodiment, the electrical contact portion is composed of gold and copper.

Figure 3A:
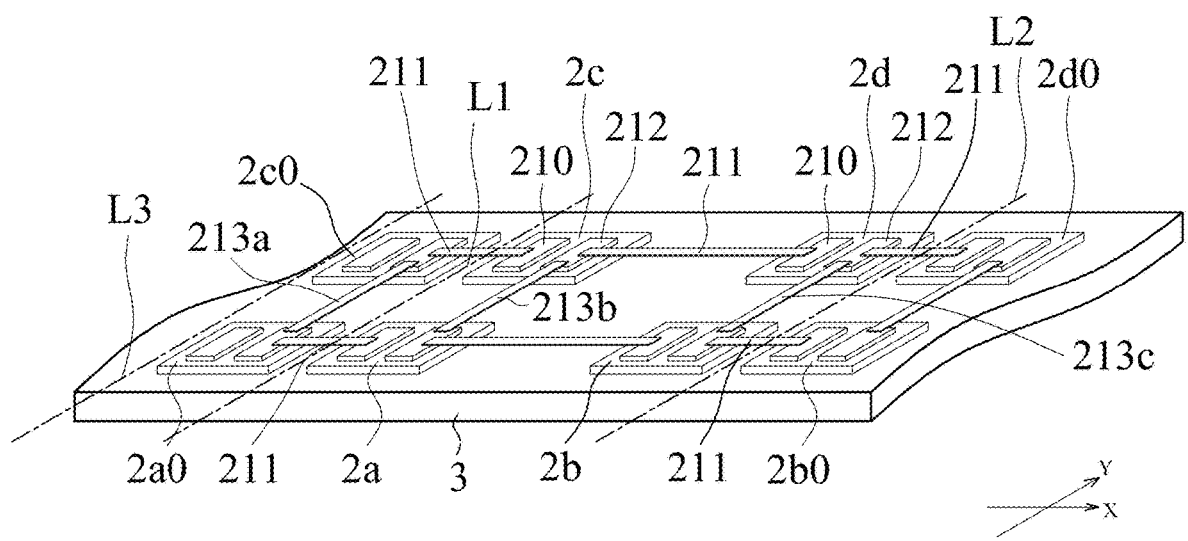
FIGS. 3A~3F show a manufacturing process of a light-emitting unit in accordance with one embodiment of the present disclosure.
Figure 3B:
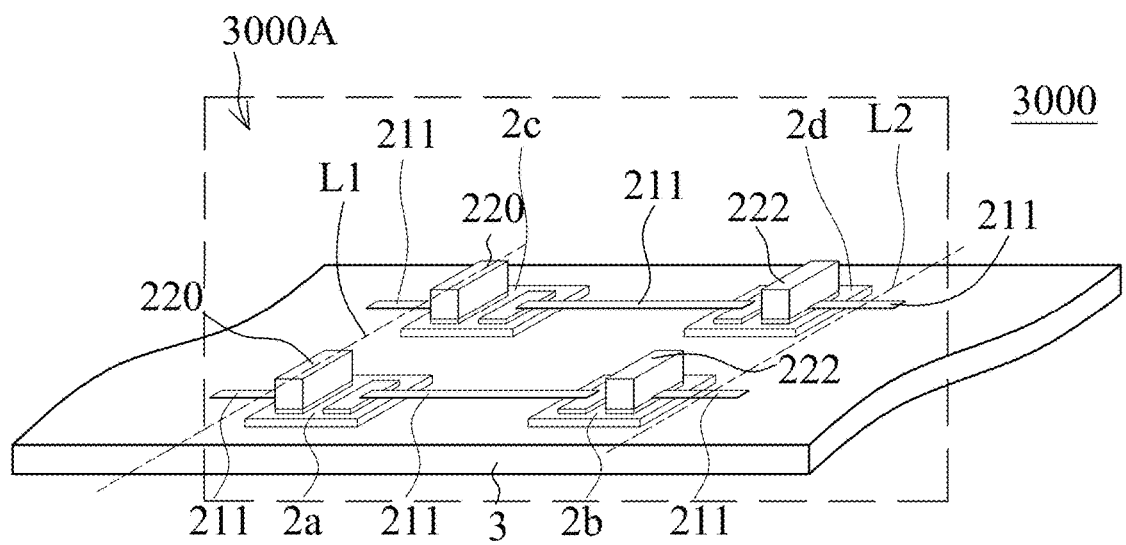
Figure 3C:
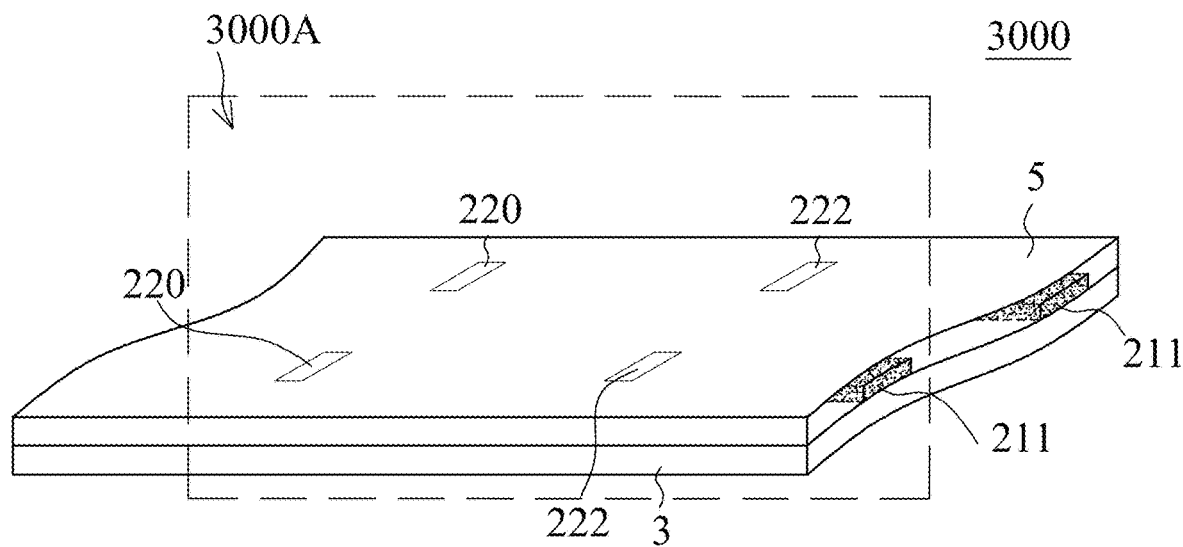
Figure 3D:
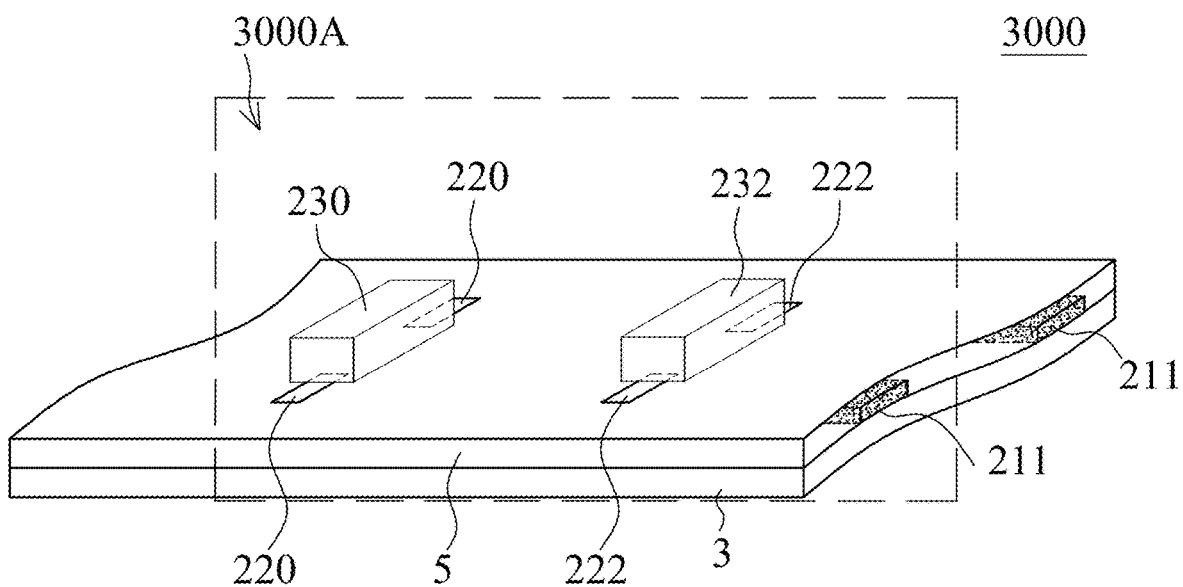

FIGS. 3A~3F show a manufacturing process of a light-emitting unit 3000A in accordance with one embodiment of the present disclosure. As shown in FIG. 3A, light-emitting elements 2a, 2b, 2c, 2d, 2a0, 2b0, 2c0 and 2d0 are electrically connected with each on the carrier 3. The light-emitting elements arranged in Y direction can be connected with each other through connection portions 213a and 213b. For example, the light-emitting elements 2a and 2c are connected through the connection portion 213b and the light-emitting elements 2b and 2d are connected through the connection portion 213c. The light-emitting elements arranged in X direction can be connected with each other through connection portion 211. Referring to FIGS. 3B and 3C, the extension portion 220 is formed on the light-emitting elements 2a and 2c and the extension portion 222 is formed on the light-emitting elements 2b and 2d as shown in FIG. 3B. A transparent layer 5 is then formed to cover the light-emitting element and the carrier 3 as shown in FIG. 3C. As shown in FIGS. 3B~3C, some elements in FIG. 3A are removed for brevity. Referring to FIGS. 3B~3D, the light-emitting structure 3000 is cut through line L1 and L2 to form the light-emitting unit 3000A. As shown in FIG. 3B, the line L1 passes through the connection portion 211 on the left side of the extension portion 220 and line L2 passes through the connection portion 211 on the right side of the extension portion 222. The light-emitting unit 3000A has light-emitting elements 2a, 2b, 2c and 2d. The extension portion 220 and 222 can extend to the surface of the transparent layer 5 as shown in FIG. 3C. Or, the extension portions 220 and 222 extend to be exposed from the surface of the transparent layer 5. The extension portions 220 and 222 can be higher than, lower than or matched with the top surface of the transparent layer 5. Therefore, the electrical contact portions 230 and 232 can be formed on the extension portions 220 and 222 which are not covered by the transparent layer 5. Through the protruded electrical contact portions 230 and 232, the electrical connection between external power or circuit and the light-emitting unit 3000A can be formed more easily. In the previous cutting step, the connection portion 211 is cut so the exposed portion of the connection portion 211 can be seen on the sidewall of the light-emitting unit 3000A as shown in FIG. 3D. The thickness of the transparent layer 5 is preferably larger than the height of the connection portion 211. For example, the thickness of the transparent layer 5 is 2 to 10 times of the height of the connection portion 211, or the thickness is larger enough to cover and/or protect the connection portion 211 and the light-emitting element.

Figure 3E:
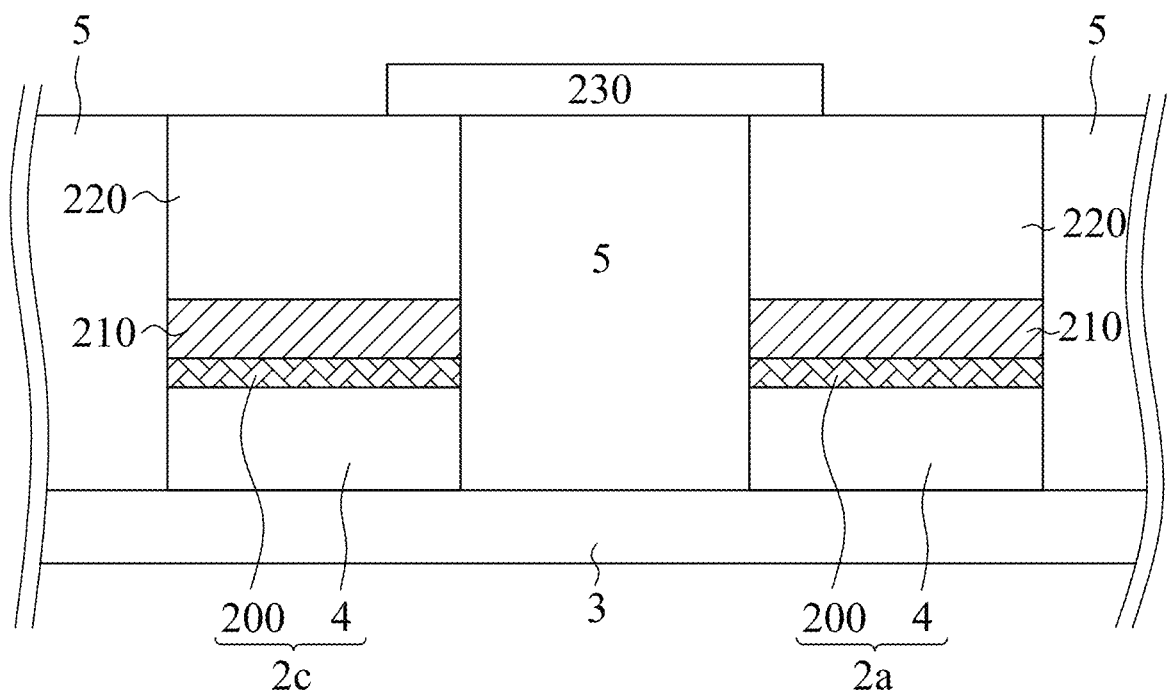
Figure 3E:
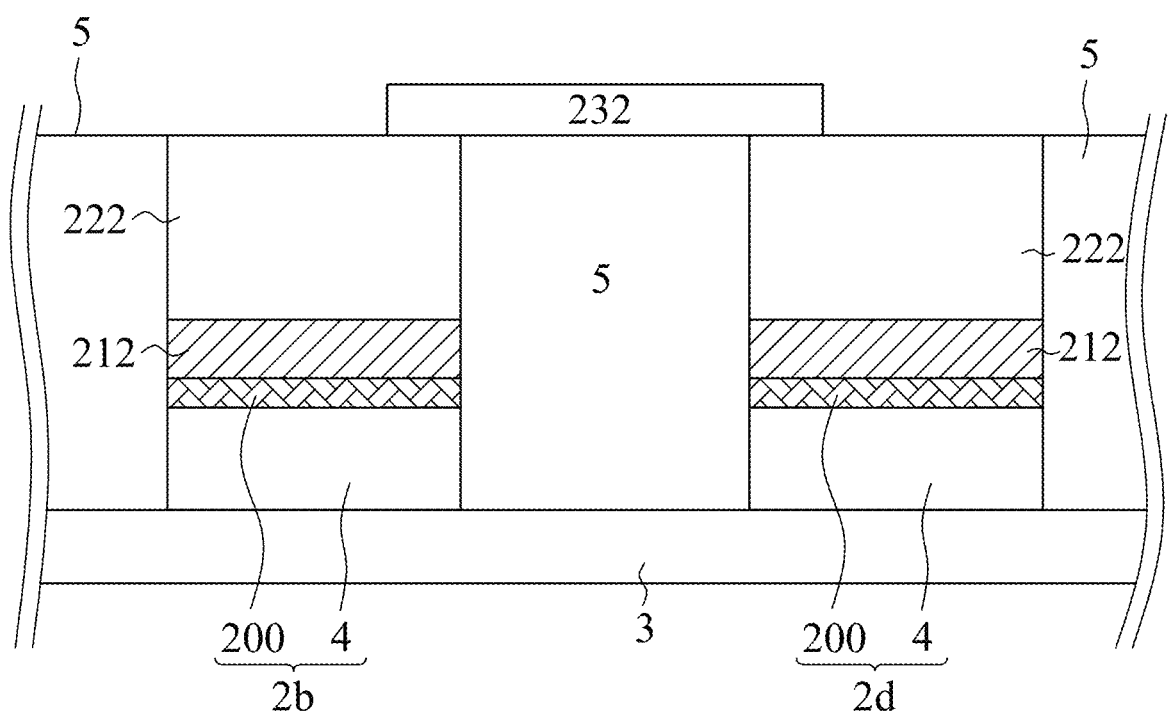

The light-emitting unit 3000A has light-emitting elements 2a~2d. As shown in FIG. 3E, the extension portion 220 is formed between the light-emitting element 2a and the electrical contact portion 230, and formed between the light-emitting element 2c and the electrical contact portion 230. The extension portion 222 is formed between the light-emitting element 2b and the electrical contact portion 232, and formed between the light-emitting element 2d and the electrical contact portion 232.

Figure 3F:
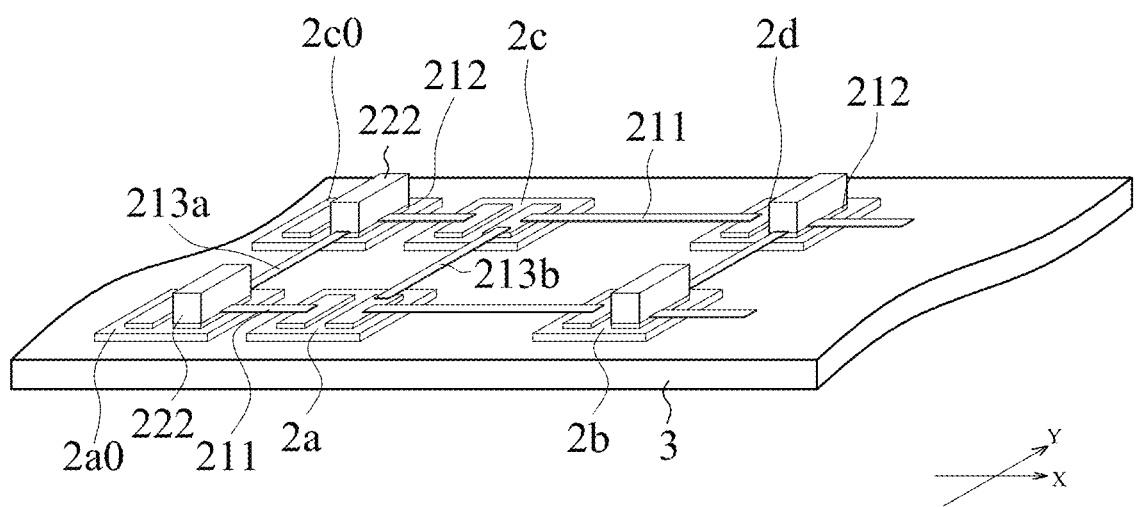

Though the light-emitting unit 3000A in the embodiment above has light-emitting elements 2a~2d, the embodiment is not a restriction to embodiments in the disclosure. The light-emitting unit 3000A can have more or less amount of light-emitting elements. For example, as shown in FIG. 3F, the light-emitting unit 3000A has light-emitting elements 2a~2d and light-emitting elements 2a0 and 2c0. The extension portion 222 can be formed on the fix portion 212 of the light-emitting elements 2a0 and 2c0 or formed on the connection portion 213a between the light-emitting elements 2a0 and 2c0. The extension portion 220 can be formed to connect the electrical contact portion 230 referring to the structure as shown in FIG. 3D. In this embodiment, the light-emitting elements 2a0 and 2c0 do not emit light while the light-emitting elements 2a~2d emit light. Referring to FIG. 3A, in another embodiment, the light-emitting unit 3000A has light-emitting elements 2a~2d and light-emitting elements 2b0 and 2d0. The extension portion 222 is electrically formed on the fix portion 210 of the light-emitting elements 2b0 and 2d0. The light-emitting elements 2b and 2d are electrically connected to the electrical contact portion 230 sequentially through the fix portion 210 on the light-emitting elements 2b, 2d, connection portion 211, fix portion 210 on the light-emitting elements 2a, 2c, and the extension portion 220. In this embodiment, the light-emitting elements 2b0 and 2d0 can be controlled not to emit while the light-emitting elements 2a~2d emit light. In other words, all of the light-emitting elements in the light-emitting unit 3000A can be controlled to emit at the same time or only part of the light-emitting elements emit light. The light-emitting elements which do not emit light, i.e. the light-emitting elements 2a0 and 2d0 in the previous embodiment, are used as a part of the electrical connection path between the light-emitting elements 2a~2d and external circuit.

According to processes described above, the connection portion is required between neighboring light-emitting elements to form a light-emitting unit as shown in FIG. 3A. However, some of the connection portions are formed during manufacturing but does not serve as electrical connection in final product because the manufacture process is simplified, for example, by using the same mask or circuit design while forming connection portions for different light-emitting units. In other words, these connection portions not served as electrical connection in final product can be omitted when making different light-emitting units by using different masks or different circuit layouts. For example, a light-emitting unit having light-emitting elements 2a, 2b, 2c and 2d is formed by cutting through the lines L1 and L2. The connection portion to be cut, such as the connection portion 211 between the light-emitting element 2d and 2d0, and the connection portion not in the light-emitting unit, such as the connection portion 213a, are not used for electrical connection in the light-emitting unit. In another embodiment, only the connection not to be cut or necessary, such as the connection portion 211 and connection portion 213c between the light-emitting elements 2b and 2d, are formed.

The flow of the current in a light-emitting device is disclosed in the following sections along with the structures shown in FIGS. 3B~3E. Referring to FIG. 3B, when the light-emitting device 3000 or the light-emitting unit 3000A is activated, the current flows into the electrical contact portion 232 and passes through the extension portion 222 connected to the light-emitting elements 2b and 2d in FIG. 3B. The current flowing into the light-emitting device 2d will flow to the light-emitting device 2c through the connection portion 211 and toward the extension portion 220. The current flowing into the light-emitting device 2b will flow to the light-emitting device 2a through the connection portion 211 and toward the extension portion 220. Referring to the structure in FIG. 3D, the current flow into the extension portion 220 of the light-emitting device 2a and the extension portion 220 of the light-emitting device 2c will be gathered to the electrical contact portion 230. Referring to the lower part of FIG. 3E, the current flowing into the light-emitting device 3000 or the light-emitting unit 3000A sequentially passes the contact portion 232, the extension portion 222, the fix portion 212, the electrode 200 and the semiconductor light-emitting stack 4. Referring to the upper part of FIG. 3E, the current flowing into the light-emitting device 3000 or the light-emitting unit 3000A sequentially passes the semiconductor light-emitting stack 4, the electrode 200, the fix portion 210, the extension portion 220 and the contact portion 230.

Figure 4A:
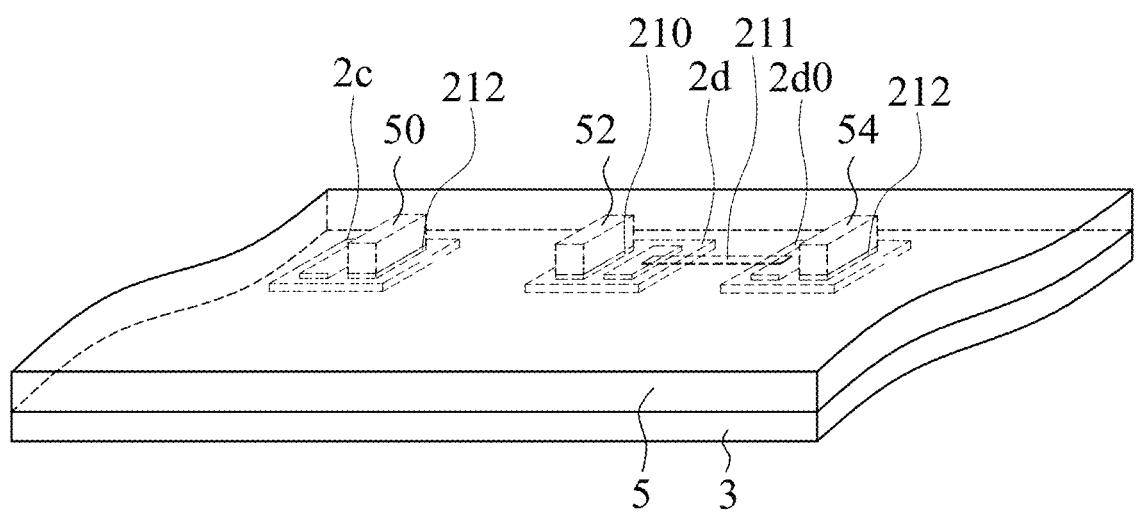
FIGS. 4A~4B show a schematic view of a light-emitting device in accordance with one embodiment of the present disclosure.
Figure 4B:
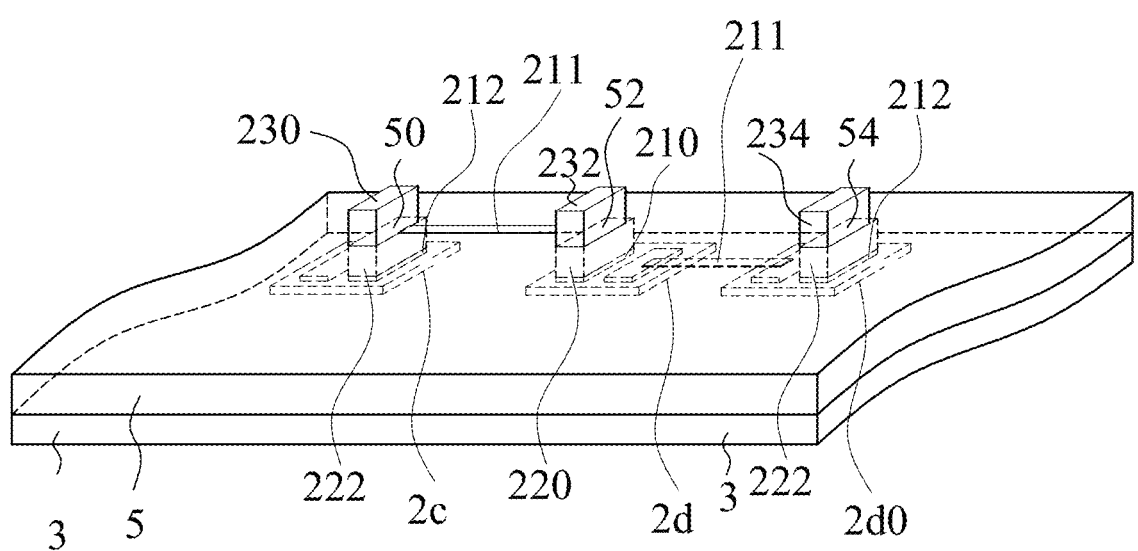

In another embodiment, circuits can be formed on other location to connect and control specific light-emitting element. Thus, the electrical connected parts between light-emitting elements, such as the connection portions 211 and 213, are not necessarily formed on the same surface of the carrier 3. For example, the connection portion can be formed on the top surface and/or the bottom surface of the carrier 3. FIGS. 4A~4B show a schematic view of a light-emitting device in accordance with one embodiment of the present disclosure. Referring to FIGS. 4A~4B, after the light-emitting device 3000 in FIG. 3A is covered by the transparent layer 5, the extension portions 220 and 222 are formed on the locations 50, 52, 54 corresponding to the connection portion 212 of the light-emitting elements 2c, 2d0 and corresponding to the connection portion 210 of the light-emitting element 2d. The electrical contact portions 230, 232,234 can be formed on the surface of the transparent layer 5, and the connection portion 211 can be formed between the electrical contact portions 230 and 232. The current enters the electrical contact portions 230 and 234 on the locations 50 and 54 to turn on the light-emitting elements 2d and 2d0. The current is sequentially flow through the electrical contact portion 230, the connection portion 211 on the transparent layer 5, the electrical contact portion 232, light-emitting element 2d, connection portion 211 covered by the transparent layer 5, light-emitting element 2d0 and the electrical contact portion 234. By using the structure, the electrical connection between the electrical contact portions 230 and 232 is not restricted by the size of the surface of the carrier 3 and can be formed on the transparent layer 5. The transparent layer 5 can be a glue layer which is transparent with respect to the light from the light-emitting element 2, such as silicone or transparent glue. The transparent layer also protects the light-emitting element while external force is applied. It is noted that though the electrical contact portion can be formed on the surface of the transparent layer 5, the coverage of the electrical contact portion should not block the transmission of light emitted from the light-emitting element. In that case, the electrical contact portions 230,232,234 are preferably made of material with better transparency, the sizes of the electrical contact portions should be decreased, and/or the electrical contact portions should be formed on the position which is not overlapped with the light-emitting direction. In other words, the connection portion on the transparent layer 5 can be used to realize electrical connection between electrical contact portions. Compared with the method of forming connection portion and light-emitting element on the same surface, the positions of connection portion and light-emitting element are chosen to avoid connection with unwanted light-emitting element or structure. The connection portion can be formed across the top of the light-emitting element to decrease difficulty of design, and also enable the user to check if there is break happening on the connection portion directly on the surface of the transparent layer 5.

The embodiment in FIG. 3A~3D or the embodiment in FIGS. 4A~4B shows the structure having several light-emitting elements 2 on a carrier 3 at once. The electrical connection structure and/or the electrical contact portion can be selectively formed to emit specific light-emitting element (s) 2 to provide a specific light field. Furthermore, different settings of dicing process can be applied to form one or more light-emitting units having one or more light-emitting elements 2. The light-emitting element 2 can be a semiconductor light-emitting element emitting incoherent light, wherein the light can be an invisible light or a visible light. The light-emitting device formed after dicing may have several light-emitting elements 2 emitting visible light with same or different optical characteristics or invisible light with same or different optical characteristics. The optical characteristics can be dominant wavelength, main wavelength, peak wavelength, light-emitting intensity, or light field distribution. Besides, it is optionally to form the wavelength material and the transparent layer 5 covering the wavelength conversion material on specific light-emitting element 2 and/or on some region of the light-emitting device 3000 on where the light-emitting elements are not located. The wavelength conversion material can be excited by the light emitted from the light-emitting element 2 to emit a light having a wavelength different from that of the light from the light-emitting element 2. For example, the blue light emitted from the light-emitting element can excite the wavelength conversion material to emit a yellow light, and the yellow light can be mixed with the unconverted blue light to form a white light. In another embodiment, the transparent layer 5 can have a wavelength conversion material and/or scattering particles to reflect or scatter light. Furthermore, the light-emitting unit mentioned above may have an adhesive layer formed on a side of the carrier 3 opposite to a light-emitting surface of the light-emitting unit. Besides, an electrical power supply can be formed on the same side with the adhesive layer. The adhesive layer can be a double-sided adhesive or a hook with an adhesive layer. The power supply can be a battery or a photovoltaic device such as solar cell. In that case, the entire light-emitting device or the light-emitting unit can be attached or arranged on the wall to for lighting without breaking the wall.

Figure 5A:
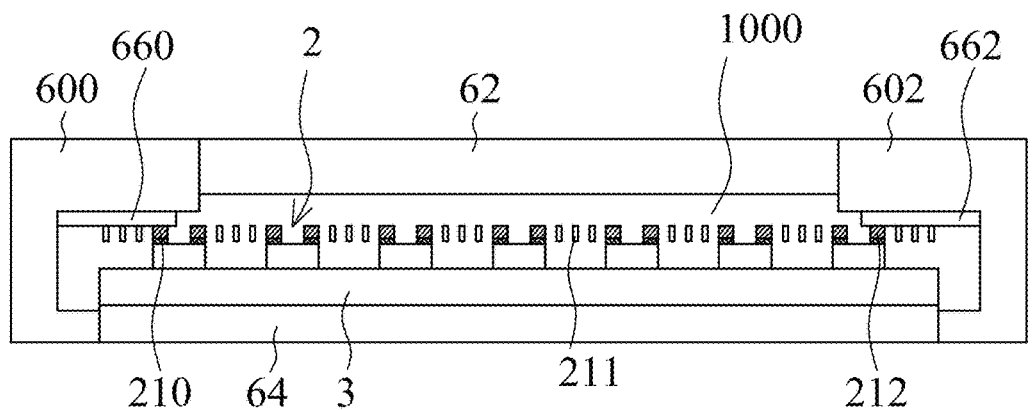
FIGS. 5A~5B show a schematic view of a light-emitting device in accordance with one embodiment of the present disclosure.
Figure 5B:
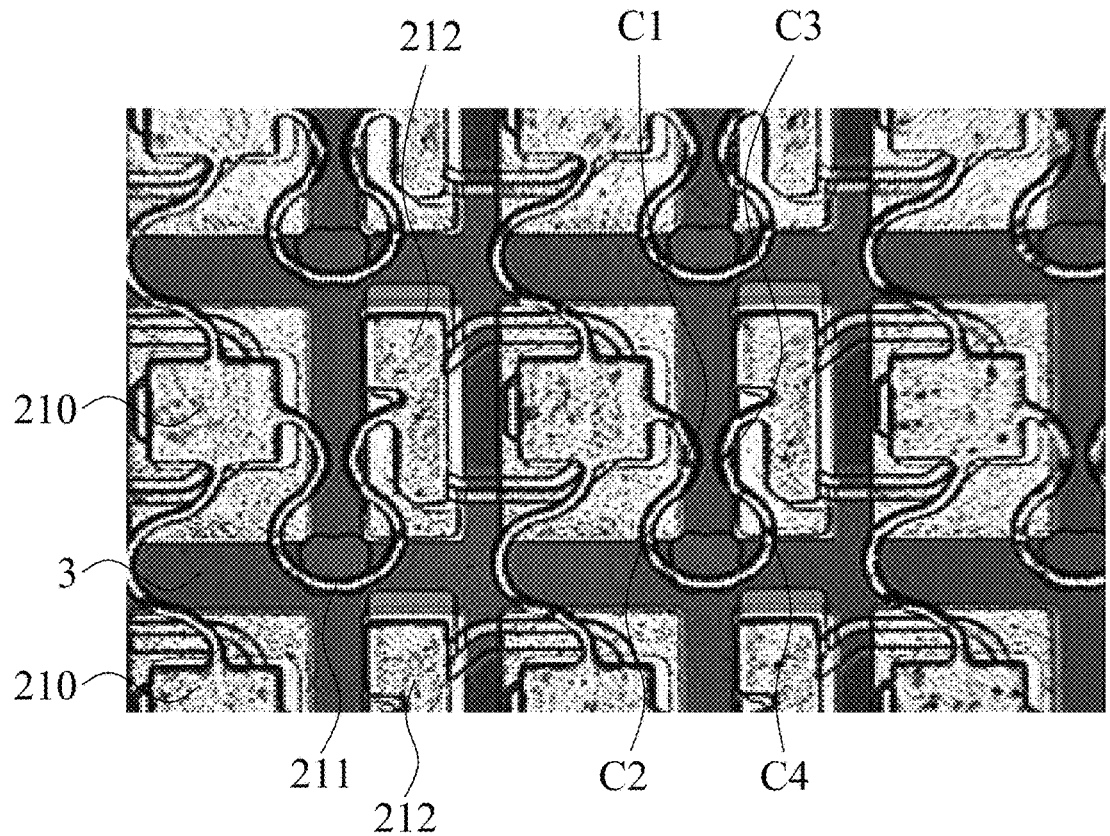

In the embodiment above, the light-emitting device or the light-emitting unit can be powered by external power supply, such as AC power from urban power supply, solar cell and battery. As the cross sectional view of the light-emitting device 4000 shown in FIG. 5A, the carrier 64, the conductive structures 600 and 602, and the light-transmissive film 62 form a space. A light-emitting device 1000 is formed on the carrier 64 within the space. The light-emitting device 1000 has light-emitting elements 2, a carrier 3 and an electrical connection structure. The conductive structures 600, 602 have conductive adhesive portions 660, 662 respectively formed thereon, and the conductive adhesive portions 660, 662 are electrically connected to the fix portions 210, 212 and the connection portion 211. The light-emitting element 2 is electrically connected to the power supply through the conductive adhesive portions 660, 662 and the conductive structures 600, 602. In another embodiment, the conductive adhesive portions 660, 662 electrically connect to only the fix portions 210, 212 but not connect to the connection portion 211. In this embodiment, the carriers 3, 64 can be made by a solid material which is not bendable. Or, the carriers 3, 64 can be made by a stretchable or bendable soft material based on the application requirement. The stretchable or bendable soft material can be polyethylene naphthalate (PEN). For example, the radius of curvature of a carrier made by PEN is between 0.38 cm and 0.45 cm. The light-emitting device 4000 can be used as a module for a light-emitting apparatus, such as a light tube, bulb, or back light module. Through electrically connecting the conductive structures 600, 602 and the corresponding parts of the light-emitting apparatus, the power from power supply can be provided to the light-emitting apparatus through the conductive structures 600, 602. Or, circuit structures (not shown in the figure), such as metal contact points or metal lines, can be further formed on the surface of the light-emitting apparatus or in the light-emitting apparatus to electrically connect to power supply. The power supply can be a battery or a photovoltaic device such as solar cell to form a movable or handheld light-emitting apparatus. In an embodiment, the battery can be made of a bendable material. The light-transmissive film 62 has a good transparency to the light from the light-emitting element 2, for example, more than 80% of the light can pass the light-transmissive film 62 without being absorbed. The light-transmissive film 62 may have scattering particles to provide wider lighting range or provide a light having better quality, such as better color uniformity and less glare. Furthermore, one or more wavelength conversion materials are formed within the light-transmissive film 62 to generate light with different colors. Wherein, these color lights are mixed with each other (without the light from the light-emitting element) or mixed with the light from the light-emitting element 2. Referring to FIG. 5B, a connection portion 211 connects neighboring fix portions 210 and 212 in a horizontal direction, and another connection portion 211 connects neighboring fix portions 210 in a vertical direction. The connection portion 211 between neighboring fix portions further has several curvatures, such as C1, C2, C3 and C4. All or some parts of the curvatures are located on the fix portion 210 and/or fix portion 212, or located on the sections of carrier 3 not covered by the light-emitting element 2. FIG. 5A shows the connection of a light-emitting element 2, a connection portion 211 and neighboring fix portions 201 and 212 in one direction (toward a single direction). FIG. 5B shows the connection of light-emitting element 2, connection portion 211 and neighboring fix portions (210 and 212 or 210 and 210) in two directions (toward two different directions). In another embodiment, connections in three directions can be formed in all or part of the regions, for example, the connection structure or another light-emitting element 2 can be formed on one light-emitting element 2 in a direction away from or close to the light-transmissive film 62. The connection can be made by forming a bendable structure mentioned above or by connecting through solder, metal combination layers or wires.

Figure 6A:
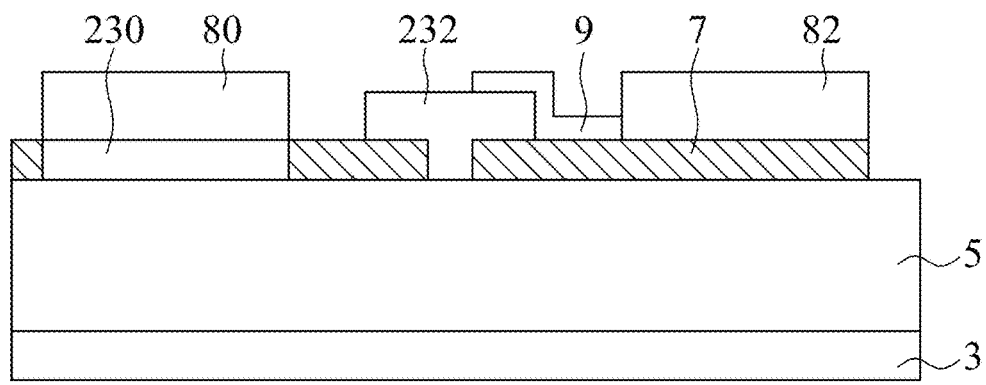
FIGS. 6A~6C show a schematic view of a light-emitting device in accordance with one embodiment of the present disclosure.
Figure 6B:
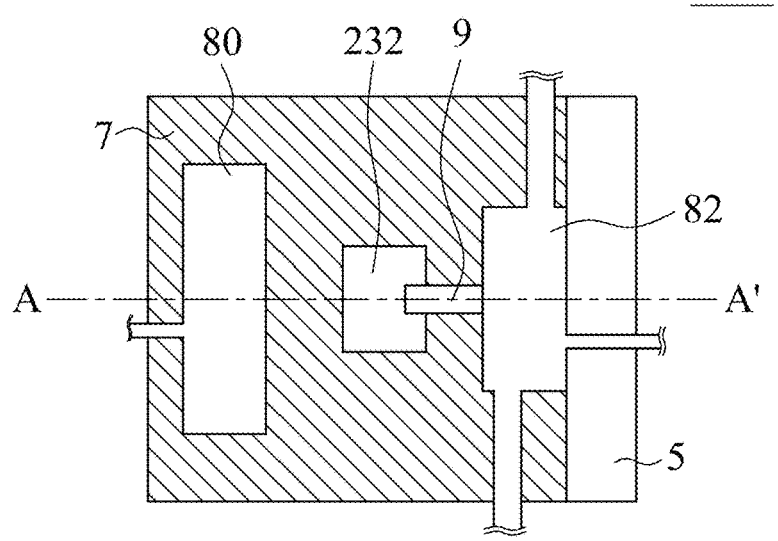
Figure 6C:
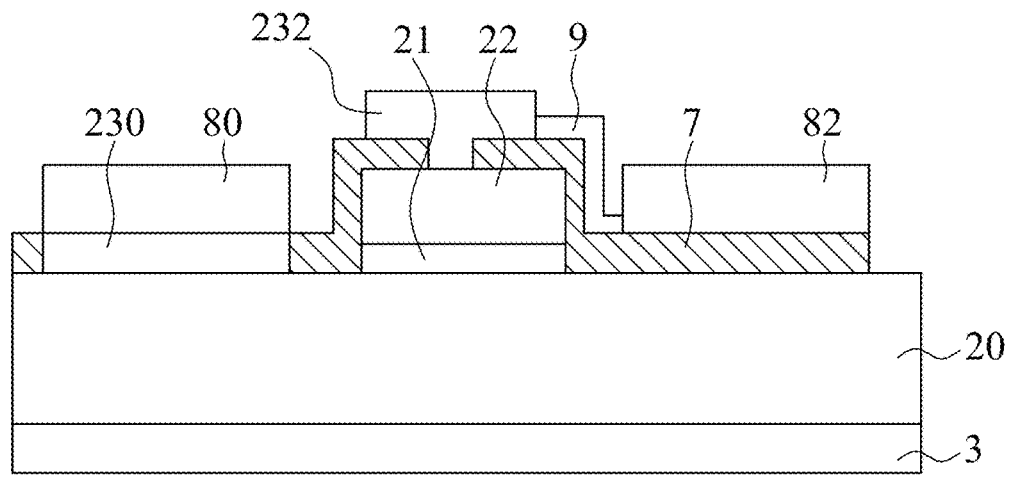

Referring to the embodiments above, the light-emitting device can have several light-emitting elements formed on a carrier 3 and a transparent layer 5 covering the carrier 3 and the light-emitting elements. Furthermore, electrical contact portions can be formed on the surface of the transparent layer 5 as shown in FIGS. 4A~4B. Referring to FIGS. 6A and 6B, the light-emitting device 5000 has a carrier 3, transparent layer 5 and light-emitting elements (not shown in the figure) covered by the transparent layer 5. The electrical contact portions 230, 232 are respectively electrically connected to two different semiconductor layers (having different conductive types). The electrical contact portions 230 and 232 are surrounded by the protection layer 7, wherein the electrical contact portions 230 and 232 are electrically isolated from each other. In the embodiment, the lower part of the electrical contact portion 232 is surrounded by the protection layer 7. The upper part of the electrical contact portion 232 and the electrical contact portion 230 are located on different surfaces. The area and the width of the upper part are larger than those of the lower part. In another embodiment, the electrical contact portions 230 and 232 can be formed on the same surface but not contacted each other directly. The wire 80 is connected to the electrical contact portion 230. The wire 82 is connected to the electrical contact portion 232 through the electronic element 9, wherein the wire 82 and the electronic element 9 are formed on the protection layer 7. In the embodiment, the electronic element 9 influences the current flowing into the light-emitting element under specific conditions. For example, the electronic element 9 is a thermistor with negative temperature coefficient (NTC) or positive temperature coefficient (PTC). When the temperature sensed by the electronic element 9 increases, the resistance of the electronic element 9 varies and changes the value of current entering the light-emitting element. By changing the connection type (serial type, parallel type, serial and parallel type) between the thermistor (the electronic element 9) and the light-emitting element, the current entering the light-emitting element is increased or decreased to change light-emitting intensity of the light-emitting element. The electronic element 9 can also be a protection device, such as a fuse. When a current larger than the safety operation range of a light-emitting element entering the light-emitting element through the wire 82 and the electrical contact portion 232, the electronic element 9 is burned and makes the circuit to be an open circuit to avoid the current entering the light-emitting element. Though some light-emitting elements are not able to emit light, the current (larger than the safety operation range of a light-emitting element) is avoided entering other light-emitting elements to protect the entire light-emitting device. In another embodiment, the electronic element 9 can be made of a material having a melting point lower than that of the material of the wire 82 or lower than that of the material of the electrical contact portions 230 and 232. When the current larger than the safety operation range of a light-emitting element is applied and increases the temperature or an abnormal increase of temperature while operating the light-emitting element, the electronic element 9 is melt to form an open circuit to protect light-emitting elements connected to the electronic element 9 from burning under abnormal operation condition. FIG. 6B is a top view of the light-emitting device 5000. FIG. 6A is a cross sectional view of FIG. 6B along the line AA'. As shown in FIG. 6B, the electrical contact portion 232 is connected to the wire 82 through the electronic element 9. As shown in FIG. 6A, the electronic element 9 contacts a sidewall of the electrical contact portion 232. In another embodiment, the light-emitting element is not covered by the transparent layer 5, and the protection layer 7 and the wires 80, 82 are formed on the carrier 3 with the light-emitting element, wherein the protection layer 7 and the wires 80, 82 are directly contacted the light-emitting element. Referring to FIG. 6C, the wire 82 and the first semiconductor layer 20 are insulated by the protection layer 7. The electrical contact portion 230 and the electrical contact 232 are insulated by the protection layer 7. The electronic element 9 and the second semiconductor layer 22 are insulated by the protection layer 7, wherein the protection layer 7 covers and contacts the sidewall of the second semiconductor layer 22. The light-emitting layer 21 is formed on the first semiconductor layer 20 and has an area as the same as that of the second semiconductor layer 22, and the light-emitting layer 21 is directly contacted with the protection layer 7. In another embodiment, the area of the light-emitting layer 21 can be the same with that of the first semiconductor layer 20.

Figure 7A:
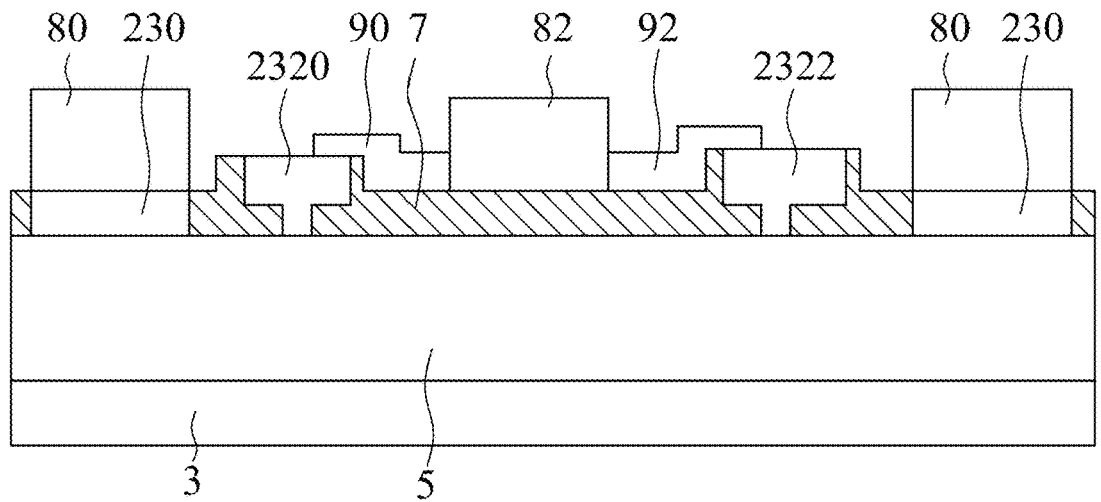
FIGS. 7A~7D show a schematic view of a light-emitting device in accordance with one embodiment of the present disclosure.
Figure 7B:
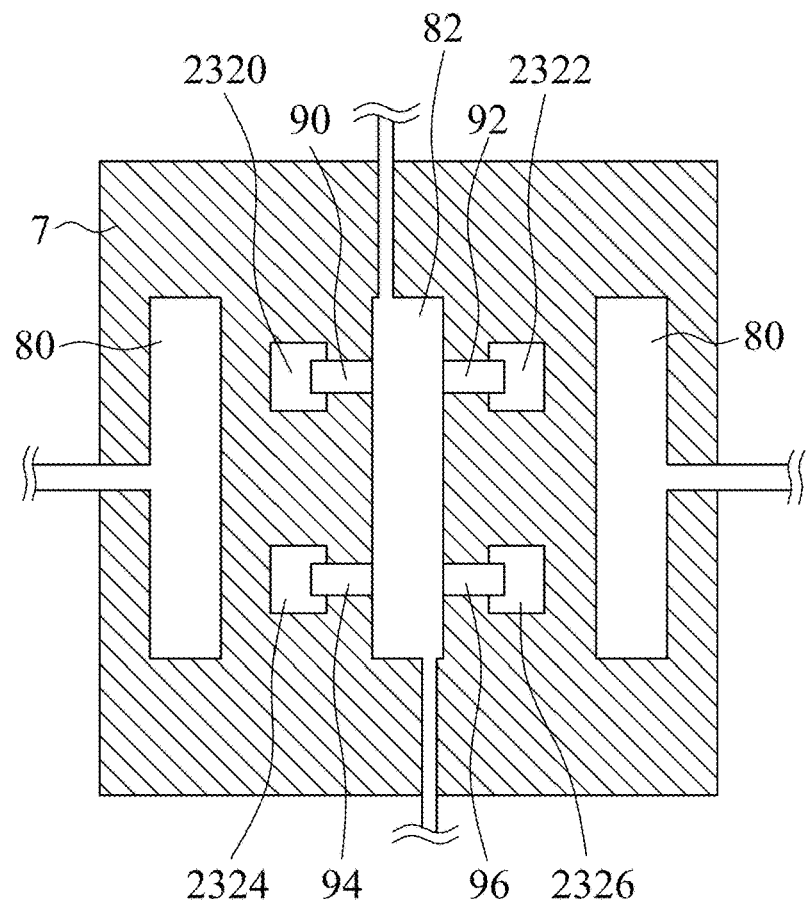

FIGS. 7A~7B show a schematic view in accordance with one embodiment of the present disclosure. The light-emitting device 6000 has a protection layer 7 covering the transparent layer 5 and the carrier 3, and the light-emitting elements (not shown in the figure) are covered by the transparent layer 5. A circuit structure is formed on the protection layer 7 to provide a path for current entering the light-emitting elements in the light-emitting device 6000. The circuit structure comprises wires 80, 82, electrical contact portions 2320, 2322 on two sides of the wire 82, and electronic elements 90, 92 electrically connected to the wire and the electrical contact portions. The wire 80 is electrically connected to the electrical contact portion 230 on two sides of the wire 80. The protection layer 7 covers a part of the sidewalls of the electrical contact portions 230, 2320, 2322. The electronic elements 90, 92 cover a part of two sidewalls of the wire 82 and covers a part of the top surfaces of the electrical contact portions 2320 and 2322. Referring to FIG. 7B, the electrical contact portions 2302, 2322, 2324, 2326 are arranged around the wire 82, wherein the electrical contact portions are not directly contacted with each other but connected to the semiconductor layer of the same conductive type, such as a p-type or an n-type semiconductor layer. The electrical contact portions are electrically connected to the wire 82 through electronic elements 90, 92, 94, 96, and the current flow into the light-emitting element through the electronic element and the electrical contact portion. Compared the mechanism of providing current directly from the wire 82 into the light-emitting layer, the structure shown in FIGS. 7A and 7B divides and spreads the current into the electrical contact portions 2320, 2322, 2324, 2326 before entering the light-emitting layer.

Figure 7C:
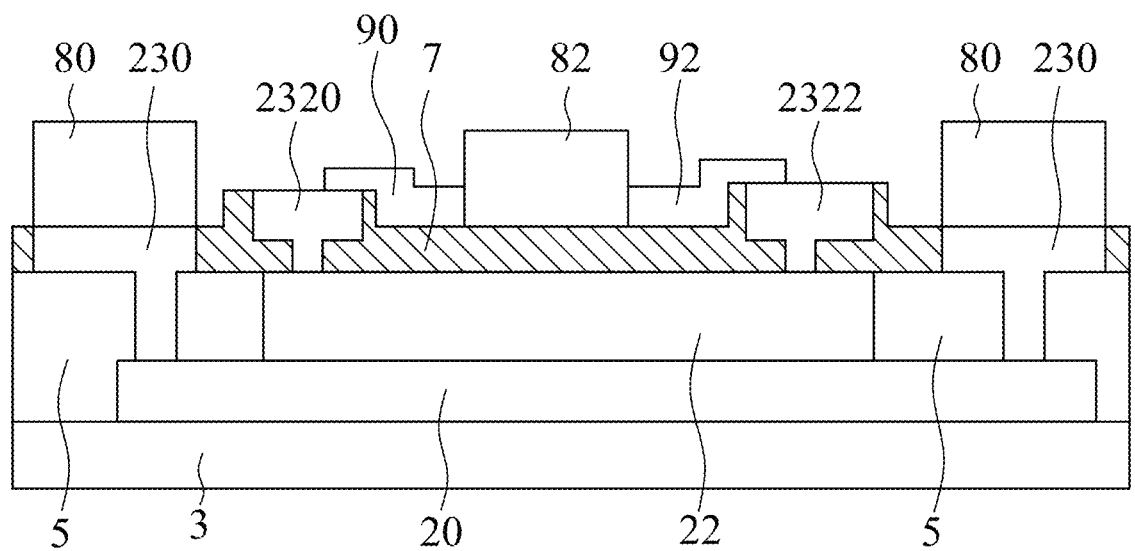
Figure 7D:
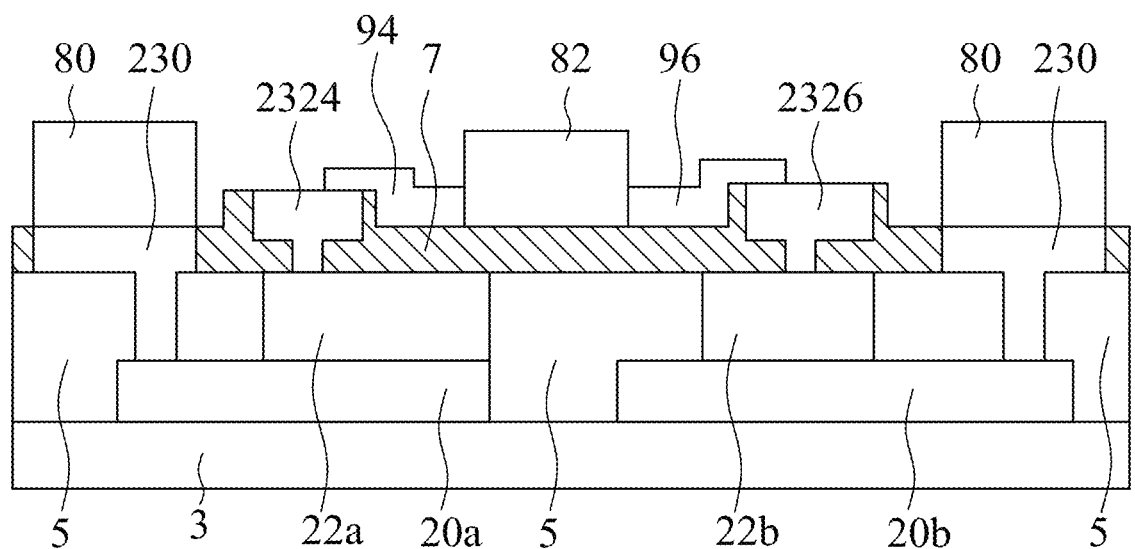

As shown in the FIGS. 7A~7D, several combinations of electronic element and the electrical contact portion are formed between the wire 82 and the light-emitting element, such as a combination of the electrical contact portion 2320 and the electronic element 90. The amount of the combinations is not limited to the embodiment in the figures, and the amount of the combination can be more or less. But the amount is not less than two. As long as one of the combinations is conductive, the light-emitting elements can be operated to emit light. Even one of the combinations is broken during manufacturing and the circuit is open, other combination of electronic element and the electrical contact portion can normally provide a conductive path for the current. Furthermore, while the combinations of the electronic element and the electrical contact portion are properly contacted with each other and the current is divided into portions, the portions of the current are arranged to flow into the light-emitting elements through paths formed by the combinations. Then, the effect of current spreading is enhanced, and the light-emitting efficiency is increased. The light-emitting device 6000 can contain one or more light-emitting elements. If the light-emitting device 6000 comprises multiple light-emitting elements, the electronic elements 90, 92 and the electrical contact portions 2320, 2322 on one side are connected to one light-emitting element; the electronic elements 94, 96 and the electrical contact portions 2324, 2326 on the other side are connected to another light-emitting element as shown in FIGS. 7C-7D. As shown in FIG. 7C, the light-emitting device 6000 has one light-emitting element electrically connected to the electronic elements 90, 92. The light-emitting element has a second semiconductor layer 22 electrically connected to the electrical contact portions 2320, 2322 and a first semiconductor layer 20 formed between the second semiconductor layer 22 and the carrier 3 electrically connected to the wire 80 through the electrical contact portion 230. As shown in FIG. 7D, the light-emitting device 6000 has two separated light-emitting elements. One light-emitting layer (not shown in the figure) is formed between the first semiconductor layer 20a and the second semiconductor layer 22a, and the other light-emitting layer is formed between the first semiconductor layer 20b and the second semiconductor layer 22b. The electrical contact portion 2324 is connected to the second semiconductor layer 22a and the electrical contact portion 2326 is connected to the second semiconductor layer 22b. The second semiconductor layer 22a only covers a part of the first semiconductor layer 20a, and the second semiconductor layer 22b only covers a part of the first semiconductor layer 20b. The transparent layer 5 covers the sidewalls of the first semiconductor layers 20a, 20b, sidewalls of the second semiconductor layers 22a, 22b and a portion of the surfaces of the first semiconductor layers 20a, 20b which are not covered by the second semiconductor layers 22a, 22b. The size of the first semiconductor layer can be the same as that of the second semiconductor layer, and the transparent layer 5 only covers the sidewalls of the first semiconductor layer and the second semiconductor layer. Or, the size of the first semiconductor layer can be different from that of the second semiconductor layer, and the transparent layer 5 covers the sidewalls of the first semiconductor layer and the second semiconductor layer and also cover a part of the surface of the first semiconductor layer. For example, part of the surface of the first semiconductor layer 20a, 20b is covered by the transparent layer 5 as shown in FIG. 7D. In another embodiment, the protection layer 7 covers the surface of the second semiconductor layer contacting the electrical contact portion and part of the side surface of the second semiconductor layer. As shown in FIG. 7D, the left light-emitting element has the first semiconductor layer 20a and the second semiconductor layer 22a, and the right light-emitting element has the first semiconductor layer 20b and the second semiconductor layer 22b. The light-emitting elements can emit lights having same or different optical characteristics. The optical characteristics can be dominant wavelength, main wavelength, peak wavelength, waveform, light-emitting intensity, or light field distribution.

The electrical contact portion 232 is arranged on single side of the wire 82 as shown in FIGS. 6A~6B, while the electrical contact portions 2320~2326 are arranged on left side and right side of the wire 82 as shown in FIGS. 7A~7B. In another embodiment, two different types of circuit structure can be applied to one light-emitting device. That is, some of the light-emitting elements in the light-emitting device can be electrically connected to external circuit through the circuit structure shown in FIGS. 6A~6B, while some of the light-emitting elements in the same light-emitting device can be electrically connected to external circuit through the circuit structure shown in FIGS. 7A~7B. In other words, the electrical contact portion 232 can be arranged only on one side of the wire 82 or formed on both right side and left side of the wire 82. Moreover, one or more electronic elements can be arranged in one light-emitting device shown in the embodiments mentioned above. The electronic element can be a thermistor, a fuse or a switching device, such as a transistor.

The light-emitting devices shown in the mentioned embodiments can have one or more light-emitting elements to emit light of same color or emit different lights of different colors. So, one light-emitting device can emit a light of one color, several colors or a mixture of different colors. For example, the light-emitting device mentioned above has a light-emitting element to emit a red light, a light-emitting element to emit a blue light and a light-emitting element to emit a green light, and theses light-emitting elements can be controlled respectively by other electronic element. The light-emitting element can be used as a pixel in a display. The electronic element used to control the light-emitting element can be a transistor.

Figure 8A:
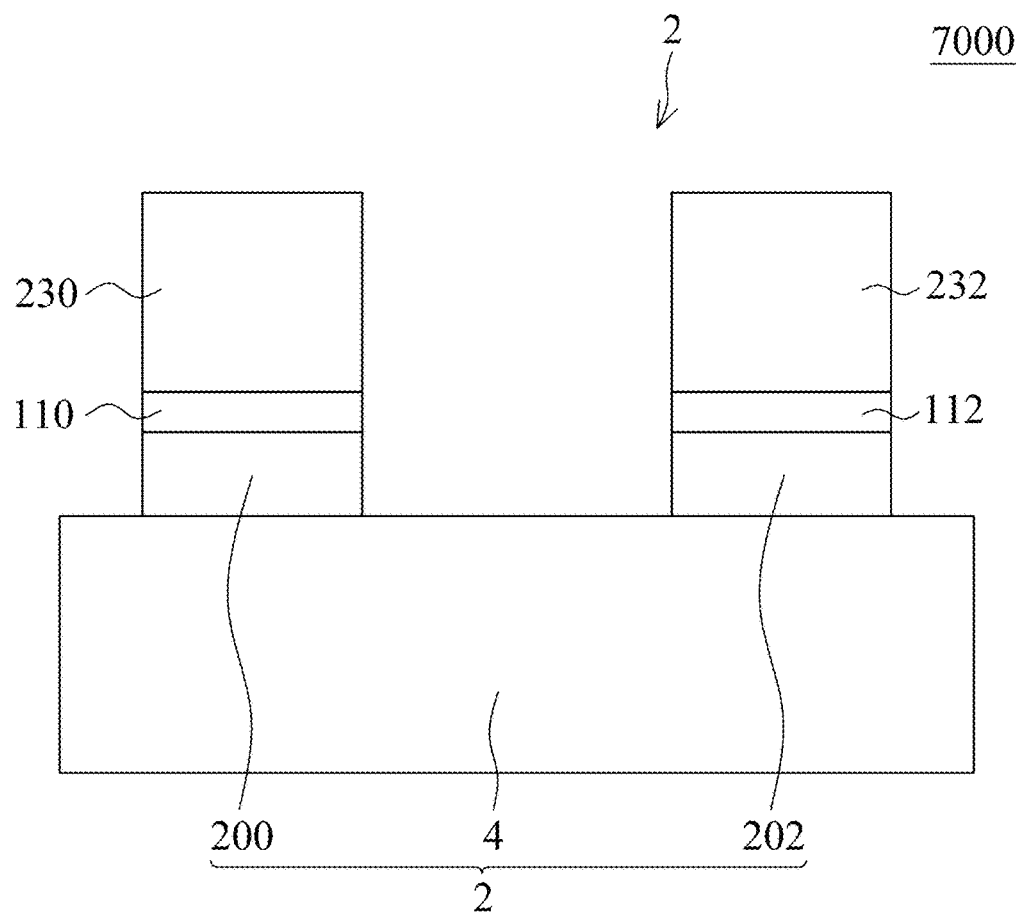
FIGS. 8A~8B show a schematic view of a light-emitting device in accordance with one embodiment of the present disclosure.
Figure 8B:
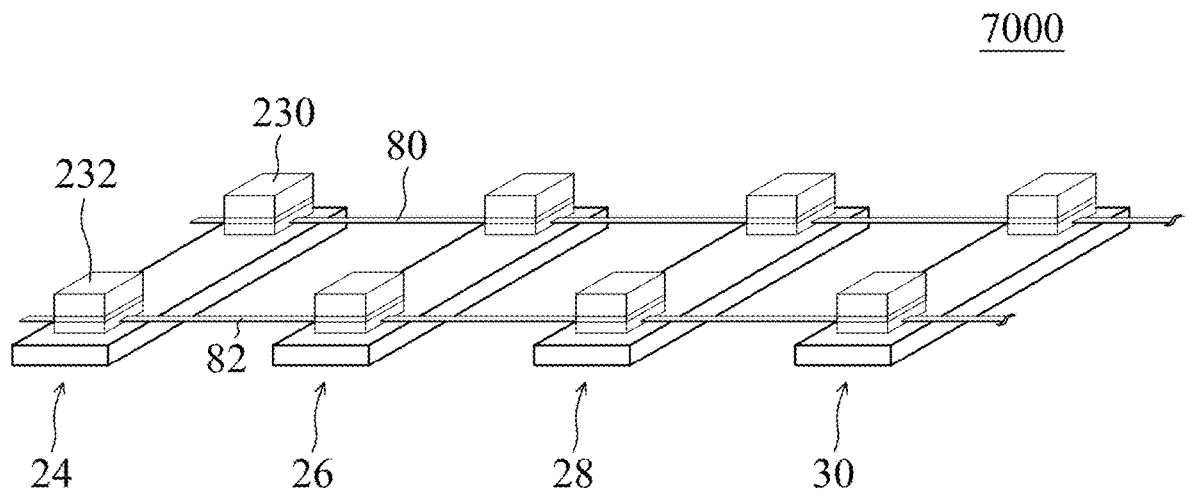

The electronic element 9 used as a fuse can be arranged on the surface of the transparent layer 5 or at other position to provide same or similar function of protection. Referring to FIGS. 8A~8B, the light-emitting device 7000 has a light-emitting element 2, electrical contact portions 230, 232 and metal layers 110, 112, wherein the metal layers 110, 112 are formed between the electrical contact portions 230, 232 and the electrodes 200, 202 of the light-emitting element 2. In an embodiment, the electrical contact portions 230, 232 comprise copper, the metal layers 110, 112 comprise metal or alloy of low melting point, and the electrodes 200, 202 comprise metal such as copper, nickel, gold, lead, antimony and silver. The alloy of low melting point can be alloy of silver and copper or alloy of lead and antimony. Referring to FIG. 8B, the light-emitting elements 24, 26, 28, 30 are connected through wires 80, 82. The structure in FIG. 8B is similar with the structure shown in FIG. 8A, wherein a metal layer is formed between the electrical contact portions and the corresponding electrode of the light-emitting elements. When a current flows from the light-emitting element 24 to the light-emitting element 30, a light-emitting element (such as the light-emitting element 26) is burned or the electrodes 200, 202 are short, an abnormal amount of heat is generated and the metal layers 110, 112 is melt because of the heat. Then, the light-emitting element 26 and the electrical contact portions 230, 232 are short. The current passing the wires 80, 82 enters the light-emitting element 28 through the wires without entering the light-emitting element 26. By arranging the metal layer between the electrical contact portion and the light-emitting element, other light-emitting elements will be normally operated while one of the light-emitting elements connected in the same circuit is failed. Thus, all of the circuit structure in the light-emitting device is protected.

The structure shown in FIGS. 8A~8B can be applied to detect defects in the structure. For example, a current of small value is provided to the structure, and the failed light-emitting element or broken wire is found by observing lighting status from the structure. Referring to FIG. 8B, a current of small value, such as a current value between 0 mA~10 mA, is applied to the parallel connected light-emitting elements 24, 26, 28, 30 in the light-emitting device 7000. Once the light-emitting element 26 does not emit light and the light-emitting element 24 (located in the former place in the current path compared with the light-emitting element 26) emits light, the electrodes or the electrical contact portions on the light-emitting element 26 of the light-emitting element 26 (the light-emitting element not emitting light) are speculated to form a short circuit. The current of small value makes the light-emitting element 24 emit light and flows to the short circuit without entering the light-emitting element 26. Then, a current can be applied to induce heat to melt the metal layers 110, 112 on the light-emitting element 26 and makes the short circuit to be an open circuit. Therefore, the current applied can be ensured to flow to the next light-emitting element, such as the light-emitting element 28. In another condition, the light-emitting element 26 does not emit light but the light-emitting elements 24, 28 emit light. The electrodes 200, 202 of the light-emitting element 26 are speculated to form an open circuit, the electrical contact portions 230, 232 on the light-emitting element 26 are speculated to form an open circuit or the light-emitting element 26 is speculated to be broken. In that case, the defect can be found by applying a current of small value. While the design formula of the structure is applied to a pixel structure in a display, the structure can avoid the display from being abandoned only because there is one broken light-emitting element. For example, a pixel is designed to have two red light-emitting elements connected in parallel, two blue light-emitting elements connected in parallel and two green light-emitting elements connected in parallel. If the positive electrode and the negative electrode of one light-emitting element (such as a red light-emitting element) form a short circuit, a current of large value can be applied to divide the red light-emitting element from the original circuit. Then, the rest of the red light-emitting element, the two blue light-emitting elements and the two green light-emitting elements in the pixel are normally operated. Therefore, the abnormal operation of a pixel arisen from one failed light-emitting element can be avoided.

Referring to the embodiment shown in FIG. 5A, the light-transmissive film 62 is arranged on the electrical connection structure and the light-emitting element. The combination can be applied to the light-emitting device 5000, 6000 or embodiments in this disclosure. The power supply comprising battery can be applied to the embodiments in FIG. 3A~3D or embodiments in FIGS. 4A~4B. The power supply of same or similar form can be applied to the light-emitting device 5000, 6000 or embodiments of this disclosure. It is noted, the sizes (comprising width and length) of added light-transmissive film or the power supply (such as battery) are substantially not larger than those of the corresponding light-emitting device.

The aforesaid semiconductor layer, light-emitting layer, protection layer, wire, electronic element, metal layer, electrode, fix portion, connection portion, extension portion, and electrical contact portion can be formed by a method of manufacturing a semiconductor layer, such as deposition and etching.

The foregoing description has been directed to the specific embodiments of this disclosure. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device comprising:
   a first semiconductor light-emitting element having a first electrode and a second electrode;
   a second semiconductor light-emitting element;
   a transparent layer covering the first semiconductor light-emitting element and the second semiconductor light-emitting element;
   a stretchable electrical connection structure entirely embedded in the transparent layer, and having a connection portion suspended in the transparent layer, a first fix portion connected to the connection portion, and a second fix portion arranged on a side opposite the first fix portion, wherein the connection portion is electrically connected to the first electrode; and an electrical contact portion electrically connected to the second electrode, and having a topmost surface higher than the transparent layer.

2. The light-emitting device of claim 1, wherein the first semiconductor light-emitting element and the second semiconductor light-emitting element are arranged on opposite ends of the stretchable electrical connection structure.

3. The light-emitting device of claim 1, further comprising a carrier on which the first semiconductor light-emitting element is formed.

4. The light-emitting device of claim 3, further comprising an adhesive layer and a power supply formed on a same side of the carrier.

5. The light-emitting device of claim 1, further comprising an extension portion formed between the first electrode and the electrical contact portion.

6. The light-emitting device of claim 1, further comprising a metal layer formed between the second electrode and the electrical contact portion, wherein the metal layer comprises antimony.

* * * * *